United States Patent
Kim et al.

(10) Patent No.: US 7,041,574 B2
(45) Date of Patent: May 9, 2006

(54) COMPOSITE INTERMETAL DIELECTRIC STRUCTURE INCLUDING LOW-K DIELECTRIC MATERIAL

(75) Inventors: Sun-Oo Kim, Fishkill, NY (US); Markus Naujok, Hsin-Chu (TW); Andy Cowley, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/894,259

(22) Filed: Jul. 19, 2004

(65) Prior Publication Data
US 2004/0259273 A1 Dec. 23, 2004

Related U.S. Application Data

(63) Continuation of application No. 10/457,217, filed on Jun. 9, 2003.

(51) Int. Cl.
*H01L 21/76* (2006.01)

(52) U.S. Cl. ............... 438/424; 438/427; 438/435; 438/624; 438/631; 438/637; 438/778; 438/958; 428/FOR. 355

(58) Field of Classification Search ........... 438/622, 438/633, 638, 644, FOR. 355, 424, 427, 438/435, 624, 631, 637, 778, 958
See application file for complete search history.

(56) References Cited

U.S. PATENT DOCUMENTS

| | | | |
|---|---|---|---|
| 6,100,590 A | * | 8/2000 | Yegnashankaran et al. . 257/758 |
| 6,187,663 B1 | | 2/2001 | Yu et al. |
| 6,245,663 B1 | * | 6/2001 | Zhao et al. ................. 438/622 |
| 6,265,307 B1 | | 7/2001 | Lou |
| 6,331,380 B1 | | 12/2001 | Ye et al. |
| 6,391,795 B1 | | 5/2002 | Catabay et al. |
| 6,423,630 B1 | | 7/2002 | Catabay et al. |
| 6,537,923 B1 | | 3/2003 | Bhatt et al. |
| 6,559,033 B1 | | 5/2003 | Hu et al. |
| 2002/0187627 A1 | | 12/2002 | Yuang |
| 2003/0068879 A1 | | 4/2003 | McDaniel et al. |

OTHER PUBLICATIONS

Matsuura, M., et al., "A Highly Reliable Self-planarizing Low-k Intermetal Dielectric for Sub-quater Micron Interconnects," IEDM 1997, pp. 785-788.
Wolf, S., "Silicon Processing For The VLSI ERA, vol. 4: Deep-Submicron Process Technology," 2002, Chapter 14, pp. 639-670, vol. 4, Lattice Press, Sunset Beach, California.

* cited by examiner

*Primary Examiner*—George Fourson
*Assistant Examiner*—Thanh Van Pham
(74) *Attorney, Agent, or Firm*—Slater & Matsil LLP

(57) ABSTRACT

A method of forming a composite intermetal dielectric structure is provided. An initial intermetal dielectric structure is provided, which includes a first dielectric layer and two conducting lines. The two conducting lines are located in the first dielectric layer. A portion of the first dielectric layer is removed between the conducting lines to form a trench. The trench is filled with a second dielectric material. The second dielectric material is a low-k dielectric having a dielectric constant less than that of the first dielectric layer.

14 Claims, 4 Drawing Sheets

COMPOSITE INTERMETAL DIELECTRIC STRUCTURE INCLUDING LOW-K DIELECTRIC MATERIAL

This application is a continuation of patent application Ser. No. 10/457,217, entitled "Composite Intermetal Dielectric Structure Including Low-k Dielectric Material," filed on Jun. 9, 2003, which application is incorporated herein by reference.

FIELD OF THE INVENTION

The present invention relates to fabrication processes and structures for semiconductor devices. In one aspect, it relates to a composite low-k dielectric structure.

BACKGROUND

Low-k dielectric materials are dielectric materials having a dielectric constant (k) lower than that of thermal silicon dioxide (i.e., k<3.9). The minimum value of k is 1.0 for air. Hence, Low-k dielectric materials are dielectric material having a dielectric constant between 1.0 and 3.9.

The use of low-k dielectric materials are important in the advancement of integrated circuit applications for semiconductor devices. One advantageous use of low-k materials in semiconductor devices is between conductor lines or structures (e.g., intermetal dielectric structures). The RC delay in switching is one factor that limits the operating speed of semiconductor devices. Generally as RC delay increases, the maximum operating speed of a semiconductor device decreases. RC delay can be reduced by decreasing resistance (R) in the conducting lines/structures and/or by decreasing the parasitic capacitance (C) developed between conducting lines/structures. This parasitic capacitance can be reduced by using dielectric materials with smaller permittivity values, which low-k dielectric materials provide.

One of the primary dielectric materials of choice for use between conducting lines in an intermetal dielectric structure has been silicon dioxide ($SiO_2$) due to its dielectric characteristics, its mechanical strength, and its ease of processing. However, silicon dioxide typically has a dielectric constant ranging from k=3.9 to 4.5, depending on the method of forming it. This k value is too high for most integrated circuit applications below about 0.18 µm. Thus, as the geometries of semiconductor devices have continued to shrink, there has been a push to develop and use new dielectric materials with dielectric-constant values much lower than that of silicon dioxide, i.e., low-k dielectric materials.

There are many trade-offs that must be considered when attempting to implement a low-k dielectric material. For example, the mechanical strength and mechanical performance of low-k materials typically decreases as the value of k decreases. Also, many low-k dielectric materials having desirable electrical properties may be incompatible with other adjacent materials and/or processes used to form or process such adjacent materials. Thus, a need exists for ways to implement low-k dielectric materials to obtain the lowered parasitic capacitance advantages even though such low-k dielectric materials may have less mechanical strength and/or incompatibility issues.

FIG. 1 shows a conventional intermetal dielectric structure 20 formed using single damascene and dual damascene processes, for example. In forming the structure 20 of FIG. 1 using conventional processes, a dielectric layer 21 is typically formed first. Then, a hard mask layer 24 is formed and patterned. Next, openings for conductor lines 26 and vias 28 are patterned, etched, and filled with a liner layer 30 and a conductive material (e.g., aluminum, copper, and/or tungsten). Thus, the dielectric layer 21 is present during several subsequent processing steps, any of which could have the potential to damage, change, or negatively affect the dielectric layer 21 (i.e., being incompatible with the dielectric layer 21).

Usually in a conventional damascene process of forming an intermetal dielectric structure 20 (e.g., as shown in FIG. 1), several integration issues must be addressed with respect to the choice of low-k dielectric material utilized for the dielectric layer 21. The low-k dielectric material usually needs to be mechanically strong and structurally stable. The low-k dielectric material typically needs to be CMP compatible (chemically and mechanically) to withstand any CMP processes involved while the dielectric material is present. Because a hard mask 24 is frequently used during the damascene processing, the low-k dielectric material may need to be compatible with the hard mask material and processes for forming, patterning, and/or removing the hard mask layer 24. Furthermore, the low-k dielectric material chosen will usually need to be compatible with the liner deposition and/or conductor deposition processes.

Because there are so many compatibility issues to consider when trying to implement, introduce, or test a new low-k dielectric material into a conventional intermetal dielectric structure 20 (see e.g., FIG. 1), the complexity, time, and cost of developing and testing new low-k dielectrics can be quite large. Hence, there is a need for a way to reduce the complexity, time, and cost of testing and implementing new low-k materials.

BRIEF SUMMARY OF THE INVENTION

The problems and needs outlined above are addressed by the present invention. In accordance with one aspect of the present invention, a method of forming a composite intermetal dielectric structure is provided. This method includes the following steps, the order of which may vary. An initial intermetal dielectric structure is provided, which includes a first dielectric layer and two conducting lines. The two conducting lines are located in the first dielectric layer. A portion of the first dielectric layer is removed between the conducting lines to form a trench. The trench is filled with a second dielectric material. The second dielectric material is a low-k dielectric having a dielectric constant less than that of the first dielectric layer.

The initial intermetal dielectric structure may further include a liner layer formed between each of the conducting lines and the first dielectric layer, and the trench may be formed between the liner layers. The initial intermetal dielectric structure may further include a hard mask layer atop the first dielectric layer, and the removing of the first dielectric layer portion may include removing a portion of the hard mask layer to form the trench. A cap layer may be formed over the second dielectric material. The second dielectric material may be etched so that it is recessed relative to the conducting lines, a cap layer may be formed over the second dielectric material, and the cap layer may be planarized to be substantially coplanar with the conducting lines. The first dielectric layer is preferably made from a low-k dielectric material. A cap layer may be formed over the composite intermetal dielectric structure. The second dielectric material may or may not be compatible with the process(es) for depositing the conductive lines, the process(es) for planarizing the conducting lines. The second dielectric material may be porous. The first dielectric layer is preferably made from a material having a mechanical strength greater than that of the second dielectric material.

In accordance with another aspect of the present invention, a method of fabricating a semiconductor device is provided. This method includes the following steps, the order of which may vary. A first dielectric layer is formed. Openings are formed in the first dielectric layer using a damascene process. The openings are filled with conductive material to form conducting lines and/or vias. A chemical mechanical polish (CMP) is performed to remove excess conductive material (if any) and to provide a substantially planar upper surface. Select portions of the first dielectric layer are patterned and etched away between at least two conducting lines to form trenches. A second dielectric material is formed in the trenches. The second dielectric material is a low-k dielectric material having a dielectric constant value less than that of the first dielectric layer. The conductive material may include copper, for example. The first dielectric layer is preferably a low-k dielectric material.

In accordance with yet another aspect of the present invention, a method of fabricating a semiconductor device is provided. A blanket layer of conductive material is formed. Conductive lines are formed in the conductive material layer. A first dielectric layer is formed between and beside the conductive lines. Select portions of the first dielectric layer are patterned and etched away between at least two conducting lines to form trenches. A second dielectric material is deposited in the trenches. The second dielectric material is a low-k dielectric material having a dielectric constant value less than that of the first dielectric layer. The conductive material may include aluminum, for example. The first dielectric layer is preferably a low-k dielectric material.

BRIEF DESCRIPTION OF THE DRAWINGS

Other objects and advantages of the invention will become apparent upon reading the following detailed description and upon referencing the accompanying drawings, in which.

DETAILED DESCRIPTION OF ILLUSTRATIVE EMBODIMENTS

Figure 1:
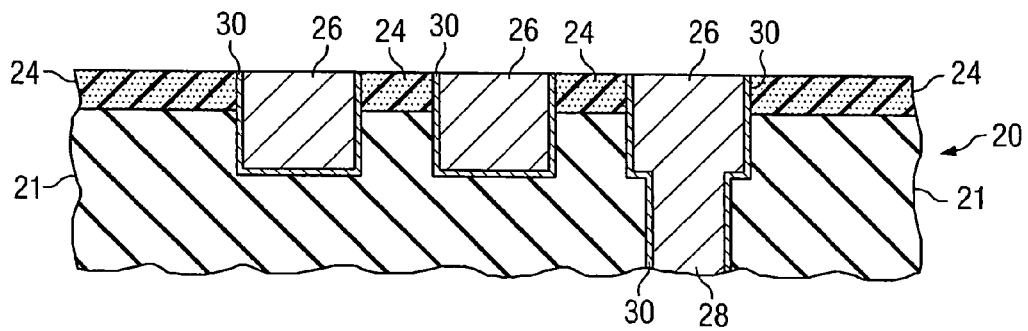
FIG. 1 is a cross-section schematic showing a conventional intermetal dielectric structure.

Referring now to the drawings, wherein like reference numbers are used herein to designate like elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Figure 2:
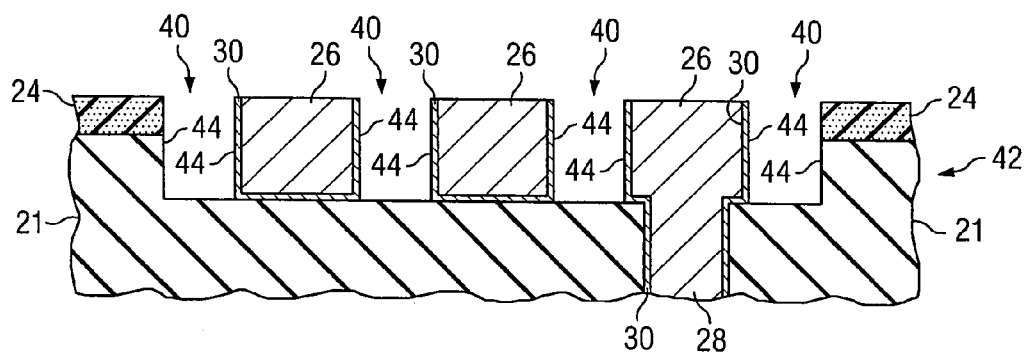
FIGS. 2 and 3 illustrate a process for a first embodiment of the present invention.
Figure 3:
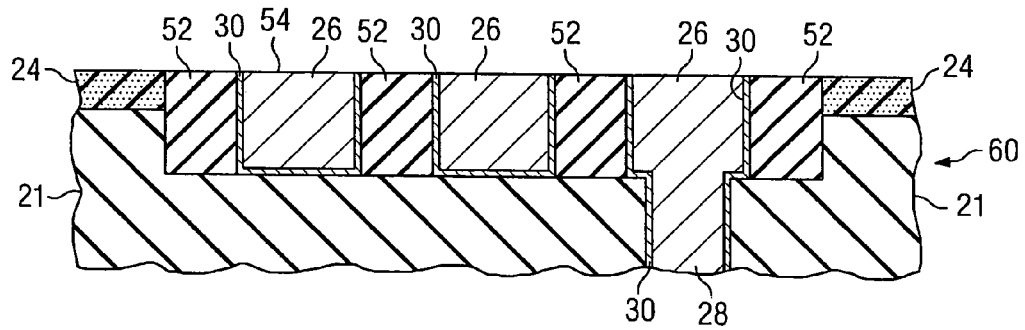

Generally, an embodiment of the present invention provides a composite low-k structure and methods of fabricating the same. FIGS. 2 and 3 illustrate a method of fabricating a composite low-k magnetic structure in accordance with a first embodiment of the present invention. FIG. 1 is a cross-section view of a portion from a semiconductor device focusing on an intermetal dielectric structure 20. The conventional intermetal dielectric structure 20 shown in FIG. 1 may have been formed by single-damascene and/or dual-damascene processes, for example. The conventional structure 20 shown in FIG. 1 provides an initial intermetal dielectric structure from which to build a composite intermetal dielectric structure of the first embodiment. The initial intermetal dielectric structure 20 may be fabricated using conventional processes, for example. However, the invention is not limited by the processes used to obtain the initial intermetal dielectric structure 20.

The initial intermetal dielectric structure 20 of FIG. 1 has a first dielectric layer 21, which may or may not be formed from a low-k dielectric material. Conducting lines 26 are formed in the first dielectric layer 21. As is often needed, a liner layer 30 is located between the conducting lines 26 and the first dielectric layer 21. However, the liner layer 30 may not be present in some applications. A via 28 is shown extending from one of the conducting lines 26 in FIG. 1. A hard mask 24 is located atop the first dielectric layer 21. This hard mask 24 may have several functions. For example, the hard mask 24 may have been used for patterning openings in the first dielectric layer 21 where the conducting lines 26 and via 28 are formed. Also, the hard mask 24 may act as a cap layer or barrier layer for the material of the first dielectric layer 21 to protect it from damage, erosion, or material changes during other processing steps occurring after the formation of the first dielectric layer 21.

The conducting lines 26 and the via 28 of the initial intermetal dielectric structure 20 (see FIG. 1) may be made from a variety of materials, including but not limited to: copper, copper alloys, aluminum, aluminum alloys, gold, silver, platinum, tungsten, tungsten alloys, heavily doped polysilicon, or any combination thereof, for example. Preferably, the conducting lines 26 are made from a material having a low resistance to help reduce the RC delay. Preferably, the conducting lines 26 are made from cooper or some copper alloy, for example. The liner layer 30 (if present) may be made from a variety of materials, including but not limited to: tantalum, tantalum nitride, tantalum-silicon-nitride, tungsten, tungsten nitride, refractory metal, or any combination thereof, for example.

Having the initial intermetal dielectric structure 20 of FIG. 1 in place, trenches 40 are formed in the structure as shown in FIG. 2. The trenches 40 may be formed using conventional patterning and etching techniques. For example, a photoresist layer (not shown) may be formed over the structure 20 of FIG. 1. Then, the photoresist layer may be patterned using photolithography, and the trenches 40 may be etched in alignment with the patterned photoresist layer (not shown). After forming the trenches 40, the photoresist layer may then be removed to provide the structure 42 shown in FIG. 2. The etching of the trenches 40 may be performed using any of a variety of etching techniques, such as wet etching, reactive ion etching (RIE), and/or ion milling, for example. Preferably, the etching of the trenches 40 is performed using RIE to provide anisotropic etching. One of ordinary skill in the art will realize that many different patterning and etching processes and/or etch chemistries may be used to form the trenches 40.

As shown in FIG. 2, the sides 44 of the trenches 40 are preferably formed along the liner layer 30. However, the trenches 40 may also be formed into or through the liner layer 30, at the edge of a conducting line 26, or partially within a conducting line 26, for example. In other embodiments not shown, the trenches 40 may be formed only within the first dielectric layer 21 such that a portion of the first dielectric layer remains between a side 44 of the trench 40 and the liner layer 30 (or between a side 44 of the trench 40 and the conducting line 26 where no liner layer 30 is present). In some applications, depending on the materials used, it may be possible to use an etch that is selective against etching the liner layer 30, for example, to contribute to etch control.

There are several techniques that may be used to control the stopping point of the etching to control the depth of the trenches 40, although the precision of the trench depth may not be critical for some intermetal dielectric layer applications. The etching depth may be controlled using a timed process, an endpoint signal control, an etch stop layer, or any combination thereof, for example. The depth of the trenches 40 may vary for different embodiments or different applications, as needed.

After the trenches 40 are formed, a second dielectric material 52 is deposited within the trenches 40, as shown in FIG. 3. The second dielectric material 52 is a low-k dielectric material with a dielectric constant (k) less than that of the first dielectric layer 21. There are a number of techniques that may be used to deposit the second dielectric material 52 into the trenches 40, including (but not necessarily limited to): chemical vapor deposition (CVD), physical vapor deposition (PVD), spin-on deposition, or sputtering, for example. When depositing the second dielectric material 52 into the trenches 40, the second dielectric material 52 may underfill, flush fill, or overfill the trenches 40. If the second dielectric material 52 overfills the trenches 40, a planarizing process (e.g., chemical mechanical polishing (CMP) or etch back) may be used, for example, to provide a substantially planar upper surface 54, as shown in FIG. 3.

The first dielectric layer 21 may be made from a variety of materials, include but not limited to: silicon oxide, silicon nitride, or low-k dielectric material, for example. The second dielectric material 52 may be made from a variety of low-k materials. Preferably the first dielectric layer 21 and second dielectric material 52 are formed from different low-k materials. It is preferred that the material used for the first dielectric layer 21 is mechanically stronger than that of the second dielectric material 52. It is also preferably that the first dielectric layer 21 is more compatible with other processes occurring after the formation of the first dielectric layer 21 than the second dielectric material 52 would be if formed when the first dielectric layer 21 is formed.

However, there may be a case where the first dielectric layer 21 is made from the same low-k dielectric material as that of the second dielectric material 52. For example, suppose the material of the first dielectric layer 21 is not compatible with all processes subsequent to its formation, and a portion of the first dielectric layer 21 is damaged or changed. The second dielectric material 52 may be substituted for some or all of the damaged or changed portions of the first dielectric layer 21 (e.g., in critical regions where the use of low-k material is most effective for reducing RC delay).

The hard mask 24 of FIG. 1 may be made from a variety of materials, including but not limited to: silicon nitride or silicon oxide, for example. The hard mask 24 may be important for use if the first dielectric layer 21 is not compatible with or is intolerant to subsequent metal deposition steps, such as UVD, IPUVD, or CVD. However, there may be embodiments where the hard mask 24 may be removed prior to the formation of the trenches 40 for the second dielectric material 52, depending upon the material choice for the first dielectric layer 21 and the subsequent metal deposition processes, for example.

Figure 4:
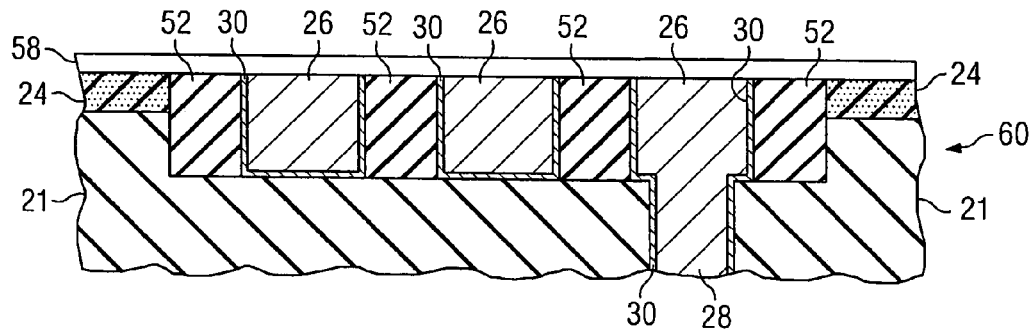
FIG. 4 shows the structure of FIG. 3 having a cap layer formed thereon.

It may also be desirable to form a cap layer or barrier layer 58 over the second dielectric layer 52 to protect it from damage or changes during subsequent processes. FIG. 4 shows the composite intermetal dielectric structure 60 of FIG. 3 with a cap layer 58 formed over the structure 60. Often if another intermetal dielectric layer structure (not shown) is to be formed over the existing intermetal dielectric structure 60 (e.g., FIG. 3), a barrier layer 58 will be formed over the existing intermetal dielectric structure anyway for other reasons, such as being an etch stop layer. Thus, the cap layer 58 of FIG. 4 may serve numerous functions within the overall structure of the semiconductor device.

Figure 5:
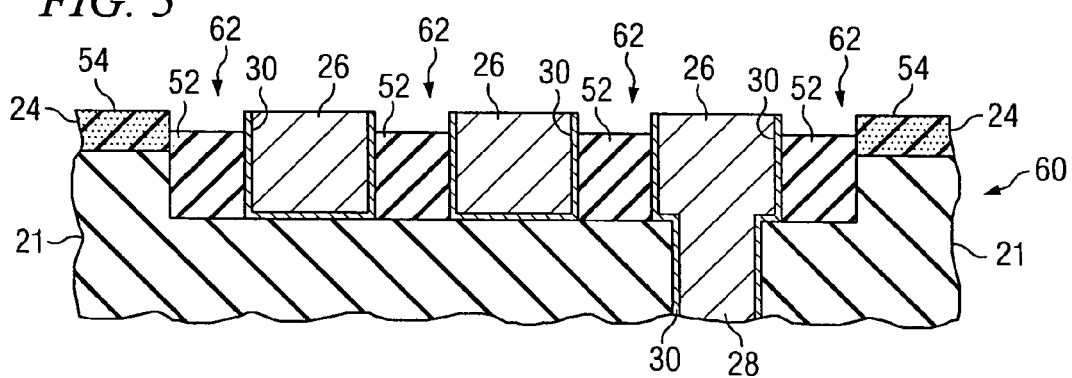
FIGS. 5 and 6 illustrate part of a process for a second embodiment of the present invention.
Figure 6:
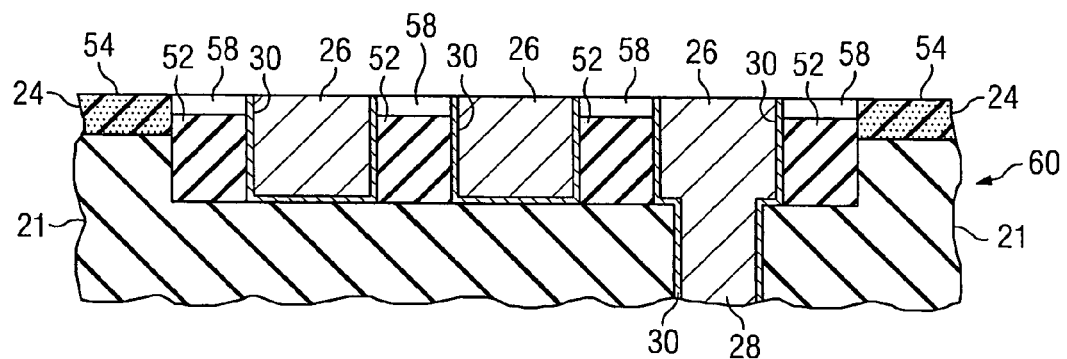

FIGS. 5 and 6 illustrate a second embodiment of the present invention. In the second embodiment, the second dielectric material 52 is recessed relative to the upper surface 54 of the structure 60 and/or relative to the conducting lines 26. Such recess 62 may be present due to intentional (or unintentional) underfilling of the trenches 40 with the second dielectric material 52, for example. Also, such recess 62 may be formed after the second dielectric material 52 is deposited with a flush fill or overfill of the trenches 40 by etching the second dielectric material 52 after it is deposited. Such etching may be performed using a selective etch and/or using a patterned masking technique, for example.

In the second embodiment, the recess region 62 above the second dielectric material 52 is filled with a cap layer or barrier layer 58 atop the second dielectric material 52, as shown in FIG. 6. It may be necessary or desirable to planarize the intermetal dielectric structure 60 after the deposition of the cap layer 58 to provide a planar upper surface 54, as shown in FIG. 6.

Figure 7:
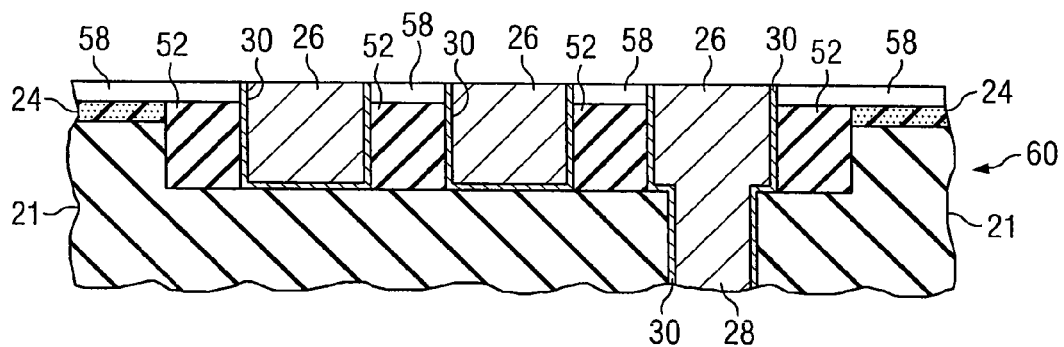
FIG. 7 shows a structure formed in accordance with a third embodiment of the present invention.
Figure 8:
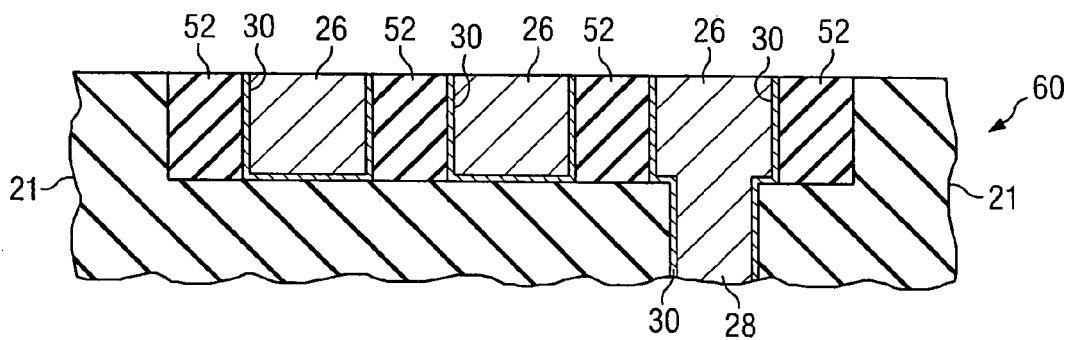
FIG. 8 shows a structure formed in accordance with a fourth embodiment of the present invention.

In a third embodiment of the present invention, the second dielectric material 52 and the hard mask 24 may be recessed relative to the conducting lines 26 and then covered with a cap layer 58, as shown in FIG. 7. FIG. 8 shows a fourth embodiment of the present invention where the hard mask 24 is not present in the composite intermetal dielectric structure 60 (e.g., the hard mask 24 may have been removed prior to forming the second dielectric layer 52).

Figure 9:
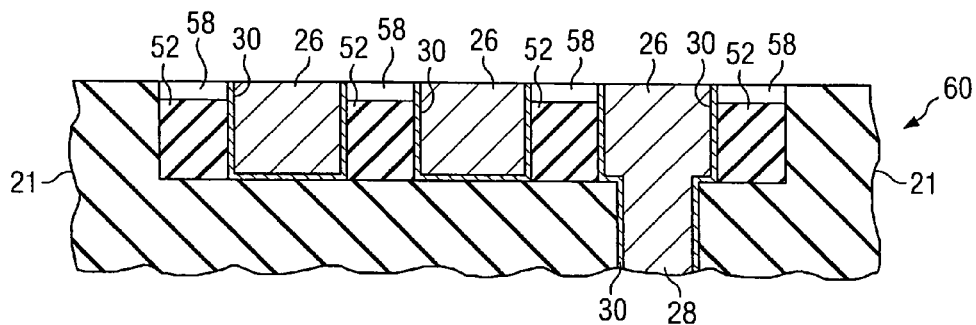
FIG. 9 shows a structure formed in accordance with a fifth embodiment of the present invention.
Figure 10:
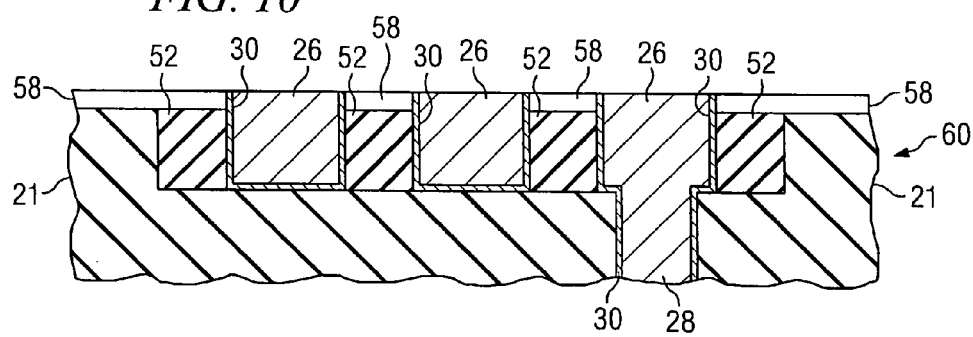
FIG. 10 shows a structure formed in accordance with a sixth embodiment of the present invention.

FIG. 9 shows a fifth embodiment of the present invention, where there is no hard mask layer 24 over the first dielectric layer 21, but the second dielectric material 52 is recessed relative to the first dielectric layer 21 and the conducting lines 26, and the second dielectric material 52 is covered with a cap layer 58. FIG. 10 shows a sixth embodiment of the present invention, where there is no hard mask 24 over the first dielectric layer 21, but the second dielectric material 52 and the first dielectric layer 21 are recessed relative to the conducting lines 26, and a cap layer 58 is formed atop the second dielectric material 52 and atop the first dielectric layer 21. With the benefit of this disclosure, one of ordinary skill in the art may realize many other embodiments of composite intermetal dielectric structures 60 fabricated in accordance with fabrication methods of the present invention.

Various methods and embodiments of the present invention may provide any combination of the following advantages. A composite intermetal dielectric structure 60 allows for tailored electrical properties at select regions. The insertion of very low-k dielectric materials 52 at select locations after the formation of other structures reduces and/or eliminates compatibility issues in processing. One reason for reduced compatibility issues is that the initial intermetal dielectric structure 20 is formed (with the conducting lines 26 and vias 28 in place) before the formation of the second dielectric material 52 (e.g., very low-k dielectric material). Hence, the second dielectric material 52 need not be compatible with the processes used to form the liner layer 30, the conducting lines 26, and/or the vias 28. Another advantage is that already tested and developed methods of forming the initial intermetal dielectric structure 20 (see e.g., FIG. 1) may be used in conjunction with an embodiment of the present invention.

Yet another advantage is that the second dielectric material 52 may be a low-k dielectric material that is mechanically weak (e.g., low modulus, low hardness, soft, and/or prone to cracking) relative to the first dielectric layer 21. In such case, the first dielectric layer 21 may be relied upon to provide structural stability to the composite intermetal dielectric structure 60, while the second dielectric material 52 provides desirable electrical characteristics in select regions (e.g., where RC delay factors need to be reduced between conducting lines 26).

With a conventional intermetal dielectric structure 20, the introduction of a new low-k material typically requires numerous integration and compatibility issues to be addressed, such as compatibility with subsequent CMP processes, compatibility with subsequent metal deposition processes, and/or compatibility with subsequent etching processes, for example. The processes and structures of embodiments for the present invention may provide the advantage of avoiding or significantly reducing these integration and/or compatibility issues. The ability to quickly and easily integrate, introduce, and/or test new low-k materials into a composite intermetal dielectric structure 60 using a process and structure of the present invention may greatly reduce the time and cost of developing and using new low-k materials.

The use of a composite intermetal dielectric structure 60 in accordance with an embodiment of the present invention provides the advantage of having a more robust and structurally stable low-k structure with good electrical performance and better package reliability, as compared to using the same low-k material (as used for the second dielectric material) in a conventional structure 20 of FIG. 1 (i.e., using the very low-k material of the second dielectric material 52 as the material for the first dielectric layer 21 in a conventional structure 20). Thus, an embodiment of the present invention provides a structurally sound intermetal dielectric structure while having tailored regions with desirable electrical characteristics (i.e., low-k). This may provide enhanced mechanical stability for the total stack of intermetal dielectric layers as well.

Furthermore, the second dielectric material 52 need not be compatible with a copper CMP process used in forming the conducting lines 26, for example. Delamination due to weak interfaces between layers may be overcome by using a more aggressive copper CMP process on the first dielectric layer 21. Then a more benign CMP process may be used to planarize the second dielectric material 52. Because the second dielectric material 52 is not present during the more aggressive copper CMP process, the compatibility of the second dielectric material 52 with the copper CMP process is not an issue. This may also reduce or eliminate distortion of thin conducting lines 26 due to lack of support from surrounding low-k material during processing of the conducting lines 26 (e.g., CMP) because the first dielectric material 21 may be made from a stronger material than that of the second dielectric material 52.

The second dielectric material 52 also need not be compatible with processes of depositing a liner layer 30 because it is formed after the liner layer deposition. Hence, in the case of porous low-k material used as the second dielectric material 52, the pores would not interfere with the liner deposition process.

When using an embodiment of the present invention, the second dielectric material 52 need not be compatible with a hard mask 24 used on the first dielectric layer 21 during the formation of the conducting lines 26. The hard mask 24 may be removed before the formation of the second dielectric material 52, for example. Also, because the hard mask 24 may be removed before the formation of the second dielectric material 52 or because part of the hard mask 24 may be etched away during the formation of the trenches 40 for the second dielectric material 52 (see e.g., FIG. 2), the hard mask 24 need not remain to increase the overall dielectric constant value for the material between the conducting lines 26 on the composite structure 60.

Although extra processing steps may be needed to form a composite intermetal dielectric structure 60 using a process of the present invention (e.g., one mask, one etch, one deposition, and one planarizing step), the results may justify such extra processing steps. Also, the advantages of the present invention may outweigh the cost and time required for extra processing steps needed to implement an embodiment of the present invention.

Each of the illustrated embodiments in FIGS. 1–10 shows conducting lines 26 and a via 28 formed using a damascene process, based on the initial intermetal dielectric structure 20 of FIG. 1. It is understood, however, that the present invention may also be used with conductors that are formed by blanket deposition and patterning (e.g., as is commonly used to form aluminum lines). In this case, the first dielectric layer 21 (see FIG. 1) may be formed after patterning the conducting lines 26, for example, and this first dielectric layer 21 may or may not be planarized with a top surface of the conducting lines 26.

Figure 11:
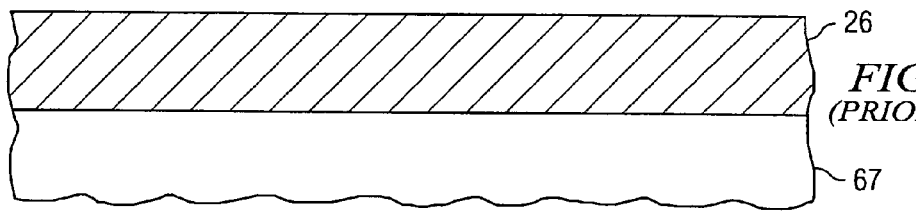
FIGS. 11–17 illustrate other embodiments of the present invention, which may continue from a prior art process illustrated in FIGS. 11–13.
Figure 12:
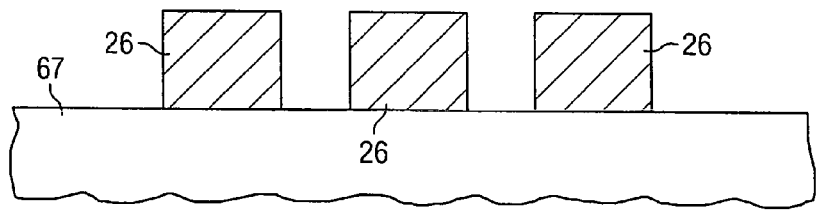
Figure 13:
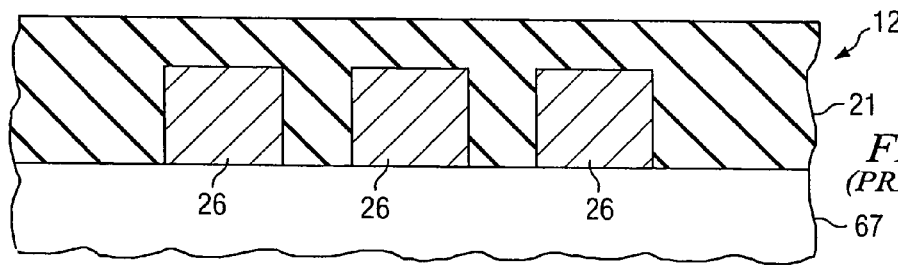

FIGS. 11–17 illustrate a method of additional embodiments of the present invention. FIGS. 11–13 illustrate conventional processing steps that are often used for conducting lines made from aluminum, for example. A blanket layer of conducting material 26 is deposited on an underlying layer 67, as shown in FIG. 11. The underlying layer 67 is shown merely for illustrative purposes here. The underlying layer 67 may be any other layer, such as a substrate, another intermetal dielectric layer, or a device formed on or in a substrate, for example. The blanket layer of conductive material is then patterned and etched to form conducting lines 26, as shown in FIG. 12, which may be provided using conventional processes, for example. Next, a first dielectric layer 21 is deposited over the conducting lines 26 to provide a conventional intermetal dielectric structure 120, which is shown in FIG. 13. Hence, the conventional intermetal dielectric structure 120 of FIG. 13 provides an initial intermetal dielectric structure for an embodiment of the present invention.

Figure 14:
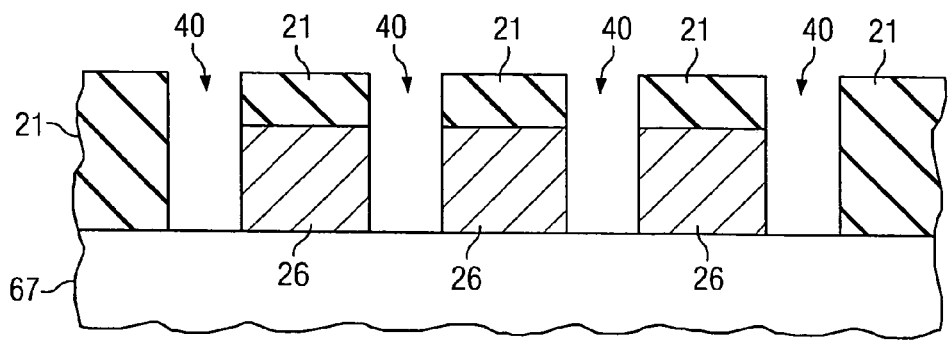
Figure 15:
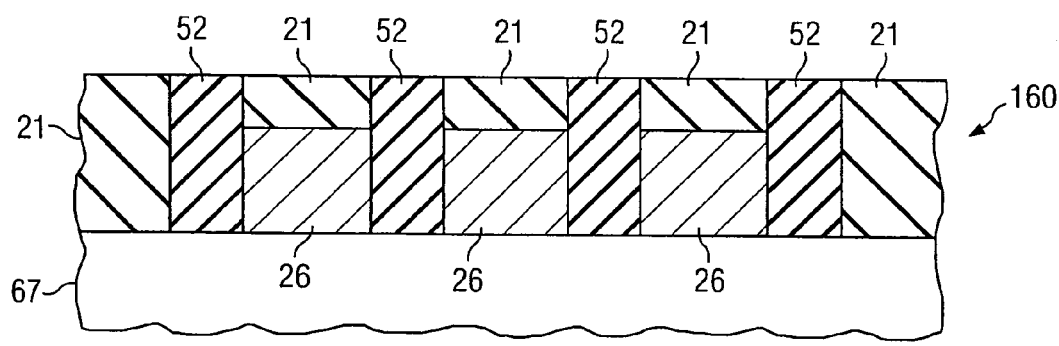
Figure 16:
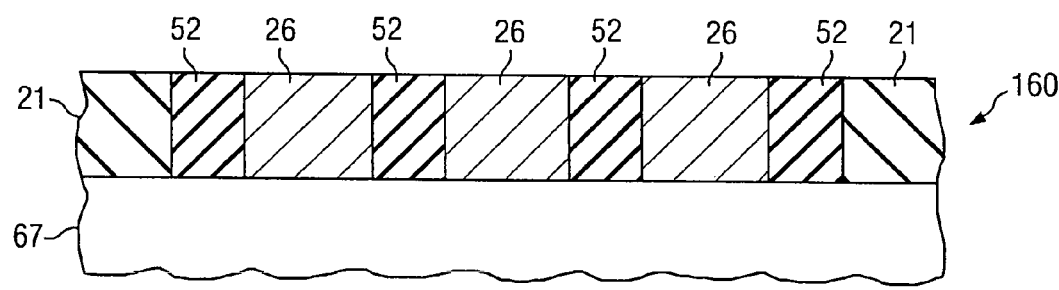
Figure 17:
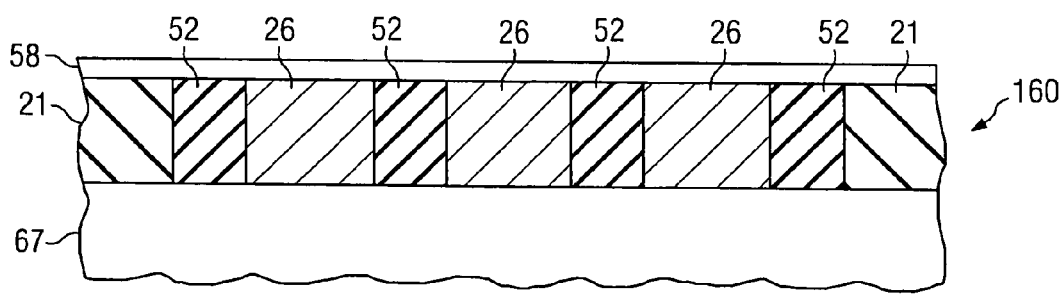

Referring now to FIG. 14, select portions of the first dielectric layer 21 are removed (e.g., patterned and etched) to form trenches 40. As shown in FIG. 15, the trenches 40 are filled with a second dielectric material 52 to form a composite intermetal dielectric structure 160. The second dielectric material 52 is a low-k dielectric material having a dielectric constant (k) value less than that of the first dielectric layer 26. After forming the composite intermetal dielectric structure 160 of FIG. 15, the structure 160 may or may not be planarized (e.g., CMP, etch back) to prepare the structure 160 for subsequent layers or processes. FIG. 16 illustrates an embodiment where the composite intermetal dielectric structure 160 has been planarized, for example. Also, if needed or desired, a cap layer or barrier layer 58 may be formed atop the composite intermetal dielectric structure 160, as shown in FIG. 17. Also, conductive vias (not shown) may be formed in the first dielectric layer before the formation of the trenches 40 and before filling the trenches 40 with a second dielectric material 52.

It will be appreciated by those skilled in the art having the benefit of this disclosure that embodiments the present invention provide a composite low-k dielectric structure. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. A method of forming a composite intermetal dielectric structure, comprising:
   providing an initial intermetal dielectric structure comprising a first dielectric layer and two conducting lines, wherein the two conducting lines are located in the first dielectric layer;
   forming a nonconductive patterned trench mask over the initial intermetal dielectric structure;
   removing a portion of the first dielectric layer between the conducting lines to form a trench in alignment with the trench mask;
   filling the trench with a second dielectric material, wherein the second dielectric material is a substantially solid material, wherein the second dielectric material is a low-k dielectric having a dielectric constant less than that of the first dielectric layer;
   etching the second dielectric material so that it is recessed relative to the conducting lines;
   forming a cap layer over the second dielectric material; and
   planarizing the cap layer to be substantially coplanar with the conducting lines.

2. The method of claim 1, wherein the initial intermetal dielectric structure further comprises a liner layer formed between each of the conducting lines and the first dielectric layer, and wherein the trench is formed between the liner layers of the conducting lines.

3. The method of claim 2, wherein the providing of the initial intermetal dielectric structure comprises:
   depositing the liner layer, wherein the second dielectric material is not compatible with the liner layer deposition.

4. The method of claim 1, wherein the initial intermetal dielectric structure further comprises a hard mask layer atop the first dielectric layer, and wherein the method further comprises removing a portion of the hard mask layer in alignment with the trench mask.

5. The method of claim 4, wherein the providing of the initial intermetal dielectric structure comprises:
   depositing the hard mask layer, wherein the second dielectric material is not compatible with the hard mask layer deposition.

6. The method of claim 1, wherein the first dielectric layer is made from a low-k dielectric material.

7. The method of claim 1, further comprising:
   forming a cap layer over the composite intermetal dielectric structure.

8. The method of claim 1, wherein the providing of the initial intermetal dielectric structure comprises:
   depositing conductive material to form the conducting lines, wherein the second dielectric material is not compatible with the conductive material deposition.

9. The method of claim 1, wherein the providing of the initial intermetal dielectric structure comprises:
   performing a planarizing process on the conducting lines, wherein the second dielectric material is not compatible with the planarizing process for the conducting lines.

10. The method of claim 1, wherein the second dielectric material is porous.

11. The method of claim 1, wherein the first dielectric layer is made from a material having a mechanical strength greater than that of the second dielectric material.

12. A method of fabricating a semiconductor device, comprising:
    providing an initial intermetal dielectric structure comprising a first level of a first dielectric material, a second level of the first dielectric material, conducting lines, and a filled conductive via, wherein the via is located in the second level of the first dielectric material, the conducting lines are located in the first level first dielectric material, and the via is electrically connected to at least one of the conducting lines;
    forming a nonconductive patterned trench mask;
    patterning and etching away select portions of the first dielectric material to form trenches in alignment with the trench mask, wherein the trenches extend into the first level of the first dielectric material ending at an upper portion of the second level of first dielectric material;
    depositing a second dielectric material in the trenches, wherein the second dielectric material is a substantially solid material, wherein the second dielectric material is a low-k dielectric material having a dielectric constant value greater than that of air and less than that of the first dielectric layer;
    etching the second dielectric material so that it is recessed relative to the conducting lines;
    forming a cap layer over the second dielectric material; and
    planarizing the cap layer to be substantially coplanar with the conducting lines.

13. The method of claim 12, wherein the initial intermetal dielectric structure further comprises a liner layer formed between each of the conducting lines and the first dielectric layer.

14. The method of claim 12, wherein the second dielectric material is porous.

* * * * *